(12) United States Patent
Iyer et al.

(10) Patent No.: US 8,578,321 B2
(45) Date of Patent: Nov. 5, 2013

(54) DELTA-SLACK PROPAGATION FOR CIRCUIT OPTIMIZATION

(75) Inventors: Mahesh A. Iyer, Fremont, CA (US); Robert L. Walker, Boulder, CO (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/482,855

(22) Filed: May 29, 2012

(65) Prior Publication Data

US 2013/0145337 A1    Jun. 6, 2013

Related U.S. Application Data

(60) Provisional application No. 61/566,471, filed on Dec. 2, 2011.

(51) Int. Cl.
  *G06F 17/50* (2006.01)
  *G06F 9/455* (2006.01)
(52) U.S. Cl.
  USPC ........... 716/133; 716/130; 716/108; 716/113; 716/132; 716/134; 716/135

(58) Field of Classification Search
  USPC .......................................... 716/103, 108, 113
  See application file for complete search history.

(56) References Cited

U.S. PATENT DOCUMENTS

| | | | |
|---|---|---|---|
| 8,316,339 B2* | 11/2012 | Iyer et al. ...................... 716/133 |
| 2009/0070715 A1* | 3/2009 | Curtin et al. ...................... 716/2 |
| 2009/0070720 A1* | 3/2009 | Bergamaschi et al. ........... 716/6 |
| 2011/0289464 A1* | 11/2011 | Iyer et al. ...................... 716/108 |

* cited by examiner

*Primary Examiner* — Nghia Doan
(74) *Attorney, Agent, or Firm* — Park, Vaughan, Fleming & Dowler LLP

(57) ABSTRACT

Systems and techniques for optimizing a circuit design are described. When a selected gate is transformed during optimization, it causes a slack value at a pin of the transformed gate to change. The change in the slack value, called the delta-slack, is then propagated through a transitive fanin cone and a transitive fanout cone of the transformed gate to compute the new slack values at all the affected pins of the design. Some embodiments update slack values without propagating arrival and required times, and also without repeatedly evaluating timing arcs to compute gate delays. The updated slack values can be used to compute timing metrics. The timing metrics can be used to decide whether or not to commit the gate transformation to the circuit design.

18 Claims, 7 Drawing Sheets

DELTA-SLACK PROPAGATION FOR CIRCUIT OPTIMIZATION

RELATED APPLICATION

This application claims priority to U.S. Provisional Application No. 61/566,471, entitled "Delta-slack propagation for physical synthesis optimization," by the same inventors, filed 2 Dec. 2011, the contents of which are herein incorporated by reference.

BACKGROUND

1. Technical Field

This disclosure relates to electronic design automation (EDA). More specifically, this disclosure relates to delta-slack propagation for circuit optimization.

2. Related Art

Circuit optimization can be performed during logical or physical synthesis. Some circuit optimization techniques iteratively replace a gate in the circuit design with other functionally equivalent gates from a library of gates. Each time the iterative circuit optimization technique replaces a gate with another gate, some optimization techniques perform a timing update of the entire design to check whether or not replacing the gate improved the circuit design.

Updating timing information (e.g., updating arrival and required-times) for the entire circuit is computationally expensive (the worst-case complexity of a full timing update can be exponential with respect to the circuit design's size). As a result, the timing update operation often becomes a runtime bottleneck in circuit optimization.

SUMMARY

Some embodiments described herein improve the performance of circuit optimization. Some embodiments described herein typically start with an initial circuit design (logical or physical circuit design). Next, the embodiments identify a gate in the circuit design for optimization depending on the parameters that are desired to be optimized. Once a gate has been identified for optimization, some embodiments perform an iterative optimization loop. In each iteration of the optimization loop, the identified gate (and possibly its neighboring gates) is (are) transformed. In some embodiments described herein, transforming a gate involves replacing the gate with another functionally equivalent gate from a library of gates. In other embodiments, transforming a gate involves (1) replacing a gate with an equivalent circuit (e.g., replacing a NAND gate with an AND gate followed by an inverter), and then (2) replacing the gates in the circuit with other functionally equivalent gates from a library of gates. Other optimization tricks like buffering or repeater insertion also apply step 2 above to size the relevant gates appropriately. The library of gates typically contains a set of equivalent gates that have different area, leakage, and delay characteristics.

After a gate has been transformed, the circuit optimization checks for timing violations. Specifically, timing information is propagated in the circuit design and timing constraints are checked against the updated timing information. Such updating of global timing information typically involves propagation of arrival and transition times in the transitive fanout logic of the affected gates, and propagation of required times in the transitive fanin logic of all the affected timing endpoints. Some embodiments described herein significantly improve the performance of timing information propagation, thereby improving the overall performance of circuit optimization.

Specifically, some embodiments described herein directly propagate new slack values into the transitive fanin and transitive fanout cones of the transformed gate. These embodiments are significantly faster than conventional techniques because these embodiments do not perform repeated evaluation of timing-arcs of logic gates while propagating timing information.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein. In this disclosure, when the term "and/or" is used with a list of entities, it refers to all possible combinations of the list of entities. For example, the phrase "X, Y, and/or Z" covers the following cases: (1) only X; (2) only Y; (3) only Z; (4) X and Y; (5) X and Z; (6) Y and Z; and (7) X, Y, and Z.

Figure 1:
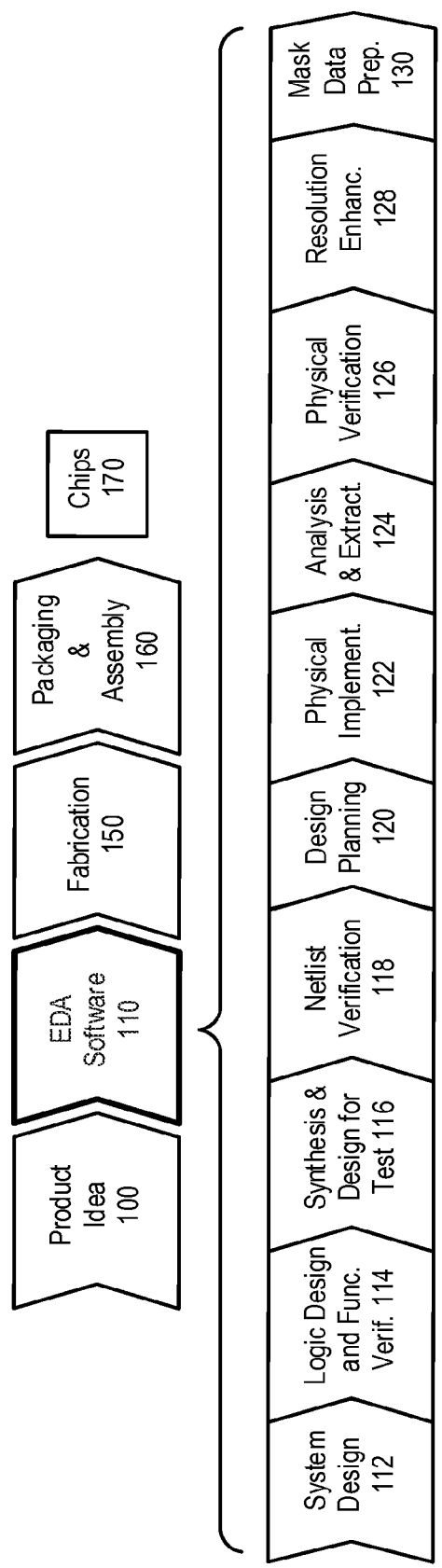
FIG. 1 illustrates various stages in the design and fabrication of an integrated circuit.

FIG. 1 illustrates various stages in the design and fabrication of an integrated circuit.

The process can start with a product idea (step 100) which can be realized using an integrated circuit that is designed using an EDA software (step 80). After the integrated circuit design is finalized, it can undergo a fabrication process (step 150) and a packaging and assembly process (step 160) to produce chips 170.

The EDA process (step 80) comprises steps 82-130, which are described below for illustrative purposes only and are not meant to limit the present invention. Specifically, the steps may be performed in a different sequence than the sequence described below.

During system design (step 82), circuit designers can describe the functionality that they want to implement. They can also perform what-if planning to refine functionality, check costs, etc. Hardware-software architecture partitioning can also occur at this stage. During logic design and functional verification (step 84), the HDL (hardware description language), e.g., SystemVerilog, code for modules in the system can be written and the design can be checked for functional accuracy, e.g., the design can be checked to ensure that it produces the correct outputs.

During synthesis and design for test (step 86), the HDL code can be translated to a netlist. Further, the netlist can be optimized for the target technology, and tests can be designed and implemented to check the finished chips. During netlist verification (step 88), the netlist can be checked for compliance with timing constraints and for correspondence with the HDL code.

During design planning (step 120), an overall floorplan for the chip can be constructed and analyzed for timing and top-level routing. During physical implementation (step 122), circuit elements can be positioned in the layout (placement) and can be electrically coupled (routing).

During analysis and extraction (step 124), the circuit's functionality can be verified at a transistor level and parasitics can be extracted. During physical verification (step 126), the design can be checked to ensure correctness for manufacturing, electrical issues, lithographic issues, and circuitry.

During resolution enhancement (step 128), geometric manipulations can be performed on the layout to improve manufacturability of the design. During mask data preparation (step 130), the design can be "taped-out" to produce masks which are used during fabrication.

Some embodiments described herein can perform circuit optimization at one or more levels of circuit abstraction. Some embodiments described herein typically start with an initial circuit design at a given level of circuit abstraction (e.g., a logical or physical design). Next, a gate is identified in the circuit design for optimization depending on the parameters that are desired to be optimized. A gate may be identified using a number of criteria. Some examples of criteria that can be used to identify a gate include, but are not limited to: (1) identifying a gate that has the worst negative slack, or a gate on the critical path that has the worst transition time for optimizing timing, (2) identifying a gate that has high leakage power for optimizing leakage power, (3) identifying a gate that has large area for performing area recovery, etc. The above-described examples of how a gate can be identified for optimization have been presented for illustration purposes only, and are not intended to limit the disclosed embodiments.

Once a gate has been identified for optimization, some embodiments perform an iterative optimization loop. In each iteration of the optimization loop, the identified gate is transformed. Transforming a gate can involve replacing the gate with another functionally equivalent gate from a library of gates, or involve first replacing the gate with an equivalent circuit, and then optionally replacing the gates in the equivalent circuit with other functionally equivalent gates from the library of gates, or involve inserting buffers or repeaters, and then optionally replacing the gate, buffers and neighboring logic with other functionally equivalent gates from the library of gates. The library of gates typically contains a set of equivalent gates that have different characteristics, e.g., different areas, power leakages, delays, etc. The terms "sizing the gate" and "optimizing the gate" are equivalent terms that refer to the process of replacing a gate that is being optimized with another functionally equivalent gate from the library of gates with the goal of improving one or more performance metrics.

When the gate is replaced with another functionally equivalent gate from the library, the optimization technique checks if the replacement improves the circuit design. According to one definition, a circuit design is improved if one or more metrics for the circuit design are improved without creating new violations. For example, if the replacement decreases the area or the leakage of the circuit design, but does not create new timing violations or worsen existing timing violations, then the replacement can be considered to have improved the circuit design.

If a gate does not improve one or more metrics for the circuit design, the gate is rejected. On the other hand, if a gate is found that improves one or more metrics, the optimization technique can commit the change to the circuit design, and can use the modified circuit design thereafter. If optimization of multiple candidate gates is found to improve the circuit design, then the optimization process can select the best gate out of the multiple gates, and commit the best gate in the circuit design. The circuit design is iteratively improved in this manner until a termination condition (e.g., a time limit, or an absence of any or significant improvement over a given time period, or all constraints being satisfied) is reached.

Determining the impact that a gate transformation has on one or more timing metrics requires timing information to be propagated in the circuit design. In conventional optimization techniques, propagating timing information requires a large amount of computation. Some embodiments described herein significantly reduce the amount of computation required to propagate timing information, and in doing so substantially improve the performance of circuit optimization.

Many circuit optimization techniques use slack at pins in the circuit design to guide optimization and to determine timing metrics. Slack is normally computed as part of static timing analysis, by first forward propagating arrival-times and transition times from circuit startpoints to every pin, and then backward propagating required-times from circuit endpoints to every pin. The slack at a pin can then be computed by subtracting the arrival-time from the required-time. A negative-slack indicates a timing violation because the signal arrives at the pin later than it is required to arrive.

When a gate is transformed, the timing information in the transitive fanout cone of the gate and the transitive fanin cone of the endpoints that are reachable from the transformed gate may be affected. The phrase "transitive fanout cone of the gate" refers to downstream (i.e., "downstream" with respect to signal propagation) gates whose arrival-times may be affected when the gate is transformed. The phrase "transitive fanin cone of the endpoints that are reachable from the transformed gate" refers to upstream (i.e., "upstream" with respect to signal propagation) gates whose required-times may be affected when the gate is transformed.

In conventional approaches, new arrival-times and required-times are propagated in the entire transitive fanin and transitive fanout cones of the transformed gate in each iteration of the optimization process. In conventional approaches, propagating arrival-times and required-times requires evaluating timing-arcs (i.e., computing the delay and transition times) across one or more pairs of input/output pins of each gate in the entire transitive fanin and transitive fanout cones of the transformed gate.

An insight used by some embodiments described herein is as follows: often the optimization process does not need the arrival-times and required-times at each pin, it just needs the resulting slack. Some embodiments described herein directly propagate new slack values into the transitive fanin and transitive fanout cones of the transformed gate instead of first propagating the arrival-times and required-times and then computing the slacks. Some embodiments described herein do not evaluate timing-arcs when propagating slack values, which makes them run significantly faster than conventional optimization approaches that evaluate timing-arcs when propagating arrival-times and required-times.

In conventional approaches, a timing-arc needs to be evaluated whenever an input transition changes. However, some embodiments described herein use the following insight: the change in the delay of a timing-arc affects the arrival-times and required-times equally, so a change in the input transition time essentially has no impact on the slack values. Some embodiments use this insight to propagate slack values in the circuit design without repeatedly evaluating timing-arcs.

Figure 2A:
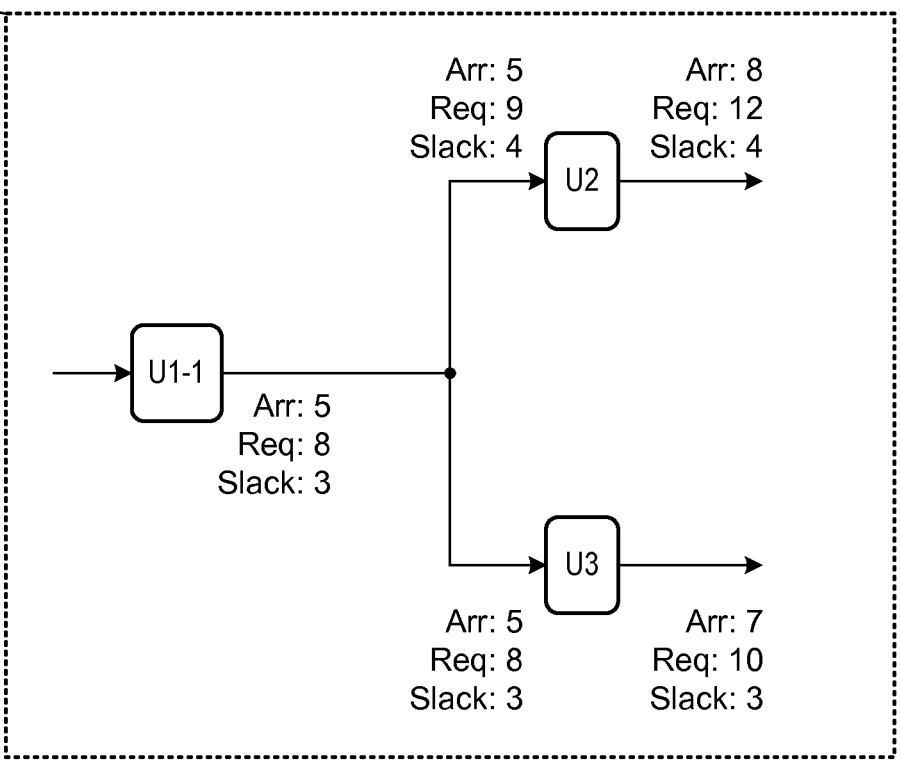
FIGS. 2A-2B illustrate how timing slacks change when a gate is transformed in accordance with some embodiments described herein.
Figure 2B:
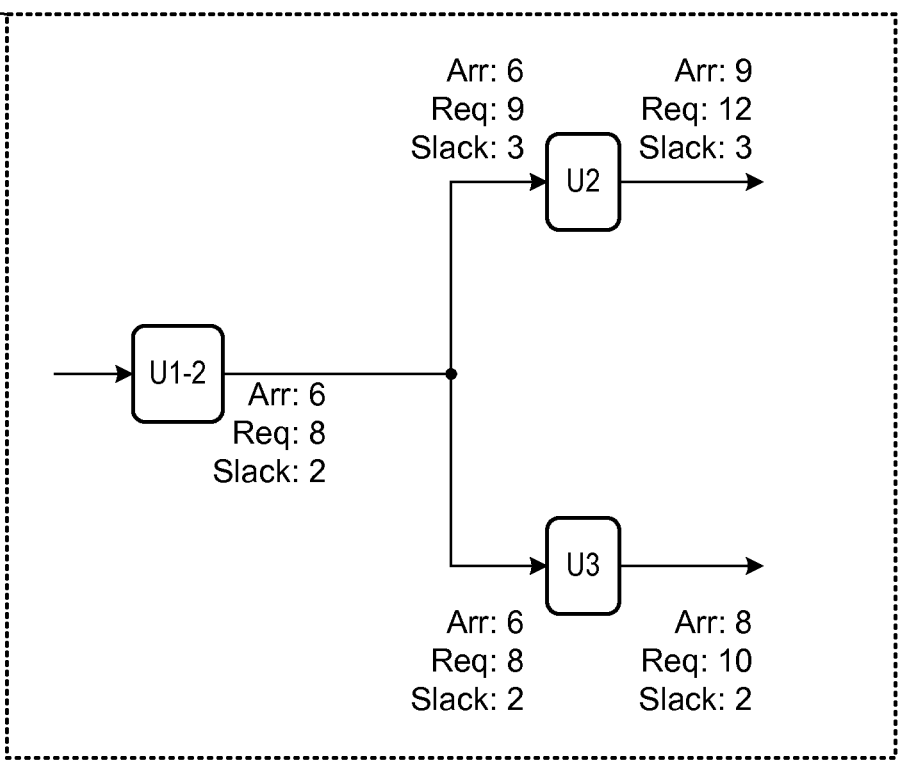

FIGS. 2A-2B illustrate how timing slacks change when a gate is transformed in accordance with some embodiments described herein.

Gates U1-1, U2, and U3 are in portion of a circuit design 200. Each gate in FIGS. 2A-2B can have one or more inputs and one or more outputs. The arrival-times, required-times, and slacks at the different pins are shown in FIG. 2A. For example, the arrival-time, required-time, and slack at the output pin of gate U1-1 are 5, 8, and 3, respectively. Without loss of generality, let us assume that gate U1-1 is identified as a candidate for optimization, and is downsized to gate U1-2 (downsizing a gate means replacing a gate with a smaller sized gate, which usually increases the gate delay). The new arrival-times, required-times, and slacks after replacing gate U1-1 with gate U1-2 are shown in FIG. 2B.

In conventional approaches, new arrival-time values and transition time values would be propagated from the point of change into the transitive fanout cone of U1-2. For example, new arrival-time values and transition time values would be propagated to gates U2 and U3 when gate U1-1 is replaced with gate U1-2. In conventional approaches, computing new arrival-times and new transition times is computationally expensive because each timing-arc along the path must be re-evaluated to determine the new arrival-time and the new transition time. In conventional approaches, after arrival-times and transition times are propagated through the transitive fanout cone, required-times are then propagated through the transitive fanin cone of all affected timing endpoints, and the new slack at each pin is computed.

In contrast to conventional approaches, some embodiments described herein directly propagate new slack values through the transitive fanin and transitive fanout cones, without propagating arrival-times and required-times. As shown in FIG. 2B, the slacks on the input and output pins of a timing-arc remains constant, even though the arrival-times and required-times have changed. This is because the change in the delay in the timing-arc through the gate affects arrival and required-time equally, and therefore the timing-arc delay cancels out when slack is computed. Some embodiments described herein use this insight to propagate new slack values without evaluating the timing-arc delay.

Figure 3A:
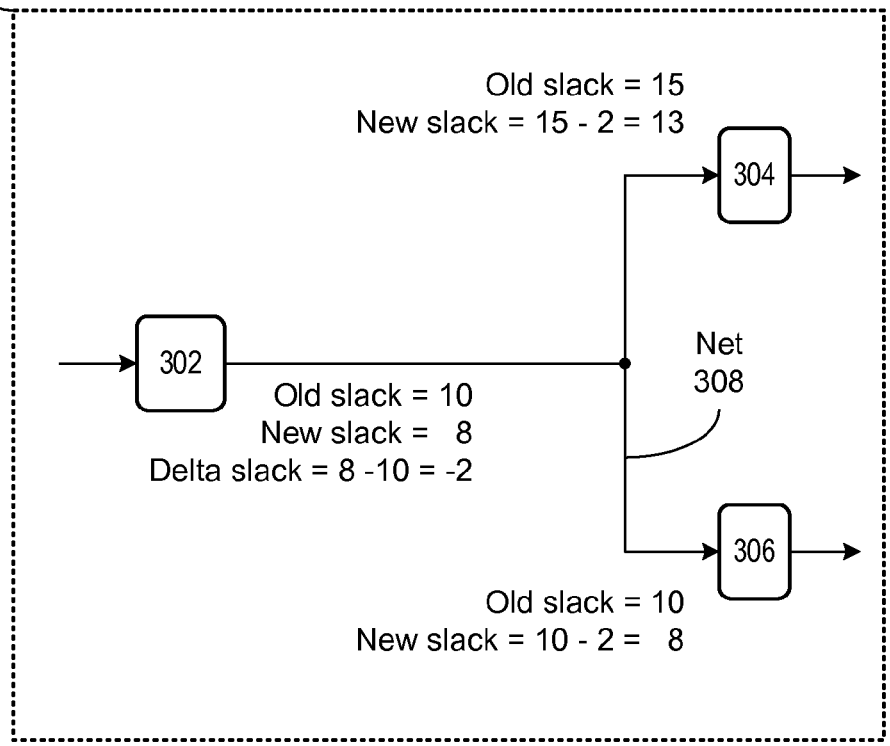
FIG. 3A-3C illustrate how slack values are directly propagated in different situations in accordance with some embodiments described herein.
Figure 3B:
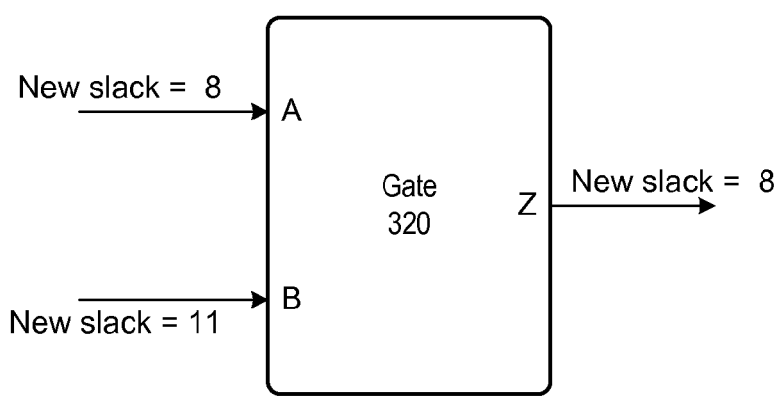
Figure 3C:
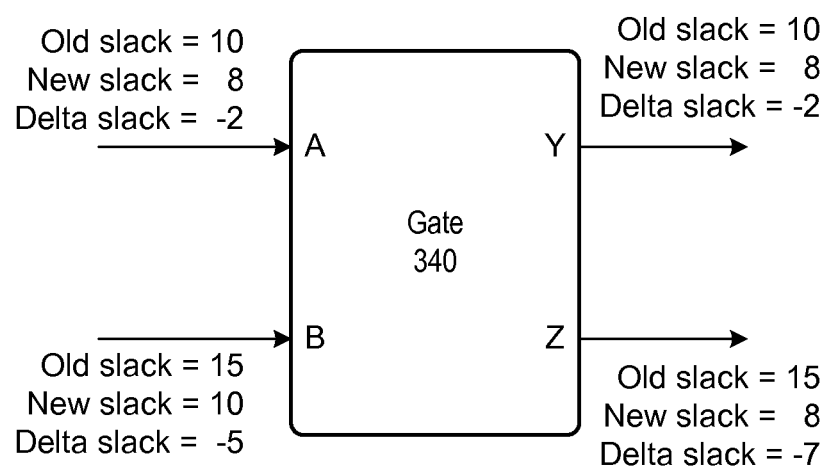

FIG. 3A-3C illustrate how slack values are directly propagated in different situations in accordance with some embodiments described herein.

When the optimization process transforms a gate in the circuit design, the changes in the slacks at the pins of the transformed gate are determined. For example, suppose that the slack at a given pin of a gate is equal to S1 before the gate is transformed, and suppose the slack at the pin is equal to S2 after the gate is transformed. Then the difference in the slack is equal to (S2-S1). This difference in the slack is called the delta-slack.

FIG. 3A illustrates how slack values are directly propagated at a branch point in accordance with some embodiments described herein.

A branch point is a point in the circuit design where a slack value is propagated to multiple points. For example, consider the situation shown in FIG. 3A. Gates 302, 304, and 306 are in a portion of a circuit design 300. Gate 302 is the replacement gate, i.e., gate 302 replaced the previous gate that was in this location. Net 308 electrically connects the output pin of gate 302 with the input pins of gates 304 and 306. Let us assume that the slack at the output pin of the previous gate (i.e., the gate that was replaced by gate 302) was 10, and after replacing the previous gate with gate 302, the slack is equal to 8. Therefore, the delta-slack is equal to 8-10=-2. Some embodiments described herein propagate the slack over net 308 by applying the delta-slack -2 to the old slack values at the input pins of gates 304 and 306. As shown in FIG. 3A, the old slack values at the input pins of gates 304 and 306 were 15 and 10, respectively. After delta-slack propagation, the new slack values at these pins is equal to 13 and 8, respectively. Note that the difference in the slack values between gates 304 and 306 has been preserved after delta-slack propagation (i.e., 15-10=13-8=+5). Also note that the resulting new slack values agree with what would have been obtained by conventional approaches (which propagate the arrival and required times and then compute the slack values).

FIG. 3B illustrates how slack values are directly propagated at a merge point in accordance with some embodiments described herein.

A merge point is a point in the circuit design where one slack value out of multiple slack values is selected for propagation. For example, consider the situation shown in FIG. 3B. A gate (not shown in FIG. 3B) was selected for optimization and was transformed. Delta-slack propagation was then performed on the transitive fanout cone of the transformed gate. Gate 320 is in this transitive fanout cone. The slack values at one or more input pins of gate 320 were updated during delta-slack propagation. For example, the slack values at input pins "A" and "B" of gate 320 were updated to the new values 8 and 11, respectively. To continue delta-slack propagation beyond gate 320 in the transitive fanout cone, the slack value at output "Z" of gate 320 needs to be determined. Embodiments described herein select the dominant slack value among the input pin slacks and propagate the dominant slack value to the output pin. The dominant slack corresponds to the worst case situation. In FIG. 3B, the dominant slack value is the minimum of the slack values of the input pins "A" and "B."

Although gate 320 has two input pins, the delta-slack propagation technique illustrated in FIG. 3B is applicable to situations where there are more than two input pins. In the general case, the dominant slack value from the multiple input pins is propagated to the output pin.

FIG. 3C illustrates how slack values are directly propagated at a merge/branch point in accordance with some embodiments described herein.

A merge/branch point is a point in the circuit design that is both a merge point and a branch point. For example, consider the situation shown in FIG. 3C. As before, a gate (not shown in FIG. 3C) was selected for optimization and was transformed. Delta-slack propagation was then performed on the transitive fanout cone of the transformed gate. Gate 340 is in this transitive fanout cone. The slack values at one or more input pins of gate 340 may have been updated during delta-slack propagation. For example, the old slack values at input pins "A" and "B" of gate 340 were 10 and 15, respectively, and they were updated to the new values 8 and 10, respectively. To continue delta-slack propagation beyond gate 340 in the transitive fanout cone, the slack values at outputs "Y" and "Z" of gate 340 need to be determined. Embodiments described herein select the dominant slack value among the input pin slacks and propagate the dominant slack value to both output pins. In FIG. 3C, the slack value 8 has been propagated to outputs "Y" and "Z," and their delta-slacks have been updated accordingly.

Although gate 340 has two input pins and two output pins, the delta-slack propagation technique illustrated in FIG. 3C is applicable to situations where there are more than two input pins and/or more than two output pins. In the general case, the dominant slack value from the multiple input pins is propagated to the output pins.

FIGS. 3A-3C illustrate how forward slack propagation is performed in the transitive fanout cone. Similarly, backward slack propagation is performed in the transitive fanin cone using the same rules except that the propagation direction is reversed. A branch point in forward propagation is equivalent to a merge point in backward propagation, and conversely a merge point in forward propagation is equivalent to a branch point in backward propagation. A merge/branch point is a merge/branch point for both forward propagation and backward propagation.

The delta-slack propagation approaches described herein may not accurately account for changes in transition time which change timing-arc delays. Any changes in the timing-arc delays (due to changes in transition time) do not themselves change the slack values because, as explained above, these changes cancel out when they are applied to both the arrival-times and the required-times. However, changes in the timing-arc delay (due to changes in transition times) can change the inputs that determine the output arrival-times. In practice however, the delta-slack propagation approaches described herein have improved performance significantly, and have had at most an insignificant or negligible impact on the quality of results.

Figure 4:
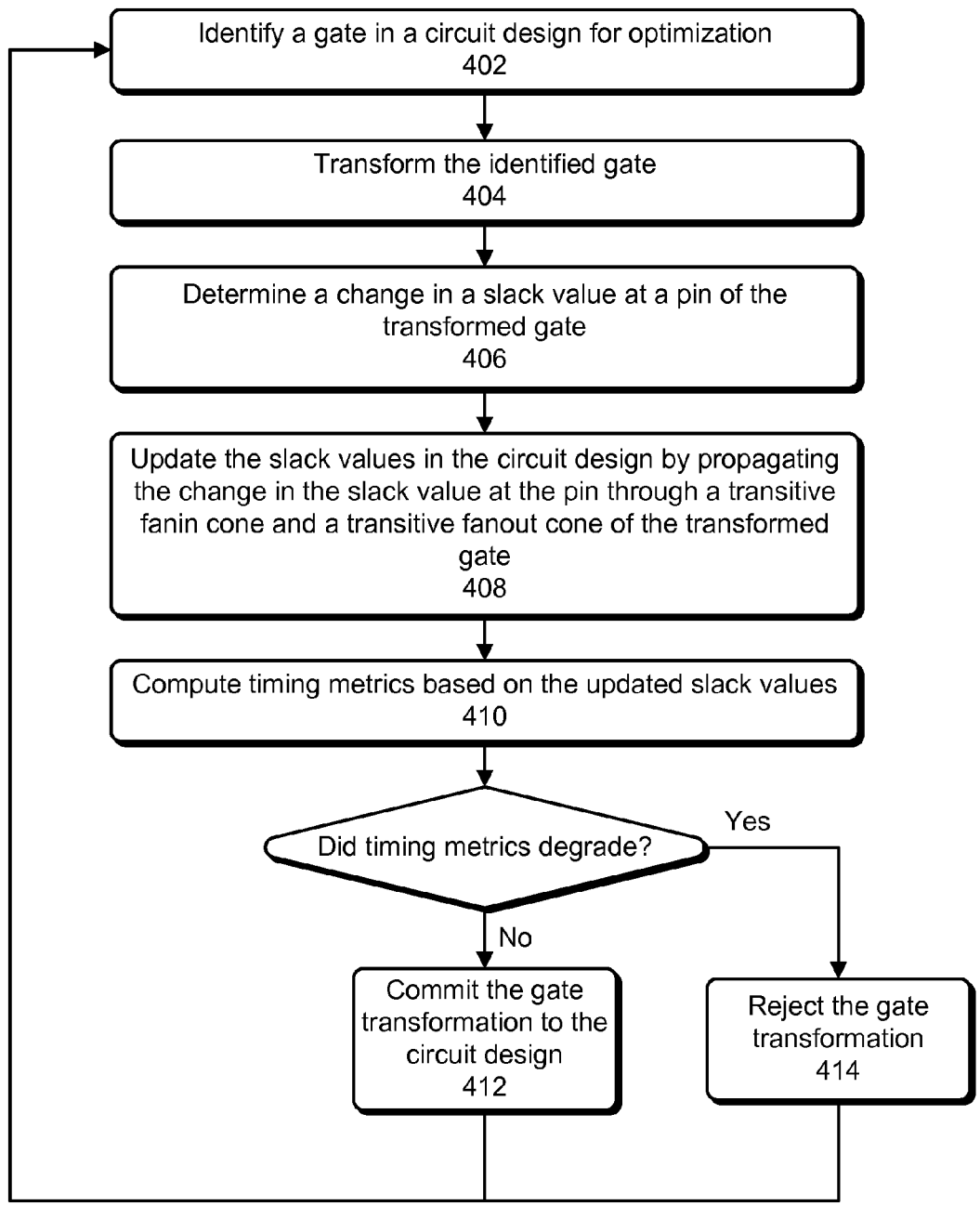
FIG. 4 illustrates a process for optimizing a circuit design using delta-slack propagation in accordance with some embodiments described herein.

FIG. 4 illustrates a process for optimizing a circuit design using delta-slack propagation in accordance with some embodiments described herein.

The process begins by identifying a gate in a circuit design for optimization (operation 402). Next, the identified gate is transformed (operation 404). In some embodiments described herein, transforming a gate involves replacing the gate with another functionally equivalent gate from a library of gates. In other embodiments, transforming a gate involves (1) replacing a gate with an equivalent circuit (e.g., replacing a NAND gate with an AND gate followed by an inverter), and then (2) replacing the gates in the equivalent circuit with other functionally equivalent gates from a library of gates. The library of gates typically contains a set of equivalent gates that have different area, leakage, and delay characteristics.

A change in a slack value at a pin of the transformed gate is then determined (operation 406). Next, the slack values in the circuit design are updated by propagating the change in the slack value at the pin through a transitive fanin cone and a transitive fanout cone of the transformed gate (operation 408). As shown in FIG. 3A, a change in a slack value can be propagated from a branch point to a set of points. Specifically, the branch point shown in FIG. 3A is electrically connected to a set of points, each of which has a current slack value associated with it. The change in the slack value at the branch point is propagated to the set of points by applying the change in the slack value to the slack values at the set of points that are electrically connected to the branch point. As shown in FIG. 3B, slack values can be propagated from a set of points to a merge point by: selecting a dominant slack value from a set of slack values at the set of points, and propagating the dominant slack value to the merge point. As shown in FIG. 3C, slack values can be propagated from a set of input points to a set of output points by: selecting a dominant slack value from a set of slack values at the set of input points, and propagating the dominant slack value to each output point in the set of output points.

One or more timing metrics are then computed based on the updated slack values (operation 410). If one or more timing metrics degraded, then the gate transformation is rejected (operation 414). On the other hand, if none of the timing metrics degraded, then the gate transformation is committed to the circuit design (operation 412). The process then returns (if a termination condition has not been met) to operation 402 to identify another gate for optimization.

Figure 5:
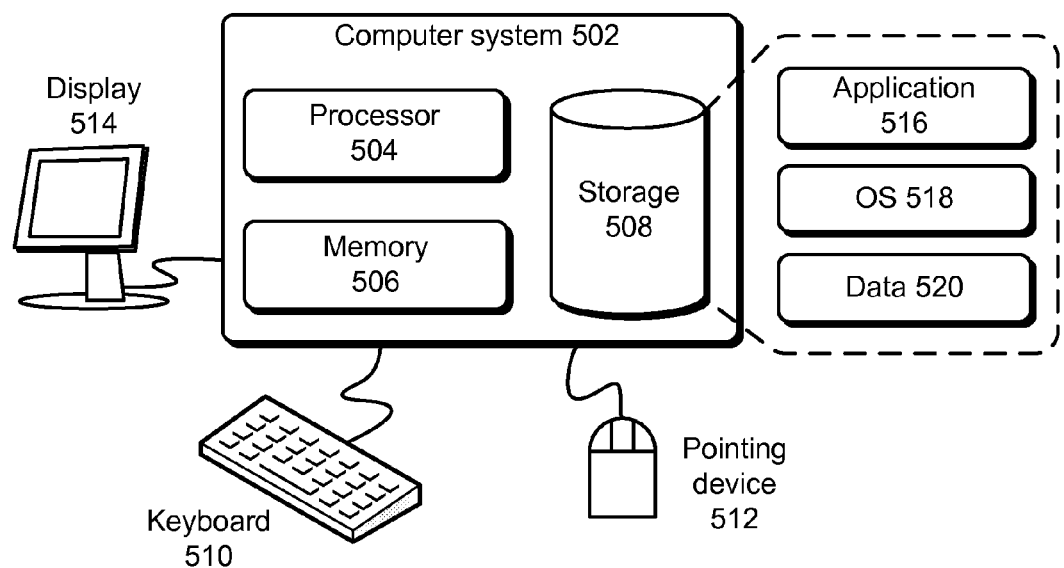
FIG. 5 illustrates a computer system in accordance with an embodiment of the present invention.

FIG. 5 illustrates a computer system in accordance with an embodiment of the present invention.

A computer system can generally be any system that can perform computations. Specifically, a computer system can be a microprocessor, an application specific integrated circuit, a distributed computing system, a cloud computing system, or any other computing system now known or later developed. Computer system 502 comprises processor 504, memory 506, and storage 508. Computer system 502 can be coupled with display 514, keyboard 510, and pointing device 512. Storage 508 can generally be any device that can store data. Specifically, a storage device can be a magnetic, an optical, or a magneto-optical storage device, or it can be based on flash memory and/or battery-backed up memory. Storage 508 can store application 516, operating system 518, and data 520.

Application 516 can include instructions that when executed by computer 502 cause computer 502 to perform one or more processes that are implicitly or explicitly described in this disclosure. Data 520 can include any data that is inputted into or outputted by application 516.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes all computer-readable storage mediums with the sole exception of a propagating electromagnetic wave or signal. Specifically, a non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for updating slack values in a circuit design, the method comprising:
    transforming a gate in a circuit design to optimize delay, area, and/or leakage power;
    determining a change in a slack value at a pin of the transformed gate, wherein the change in the slack value is with respect to a previous slack value at the pin; and
    updating, by computer, the slack values in the circuit design by propagating the change in the slack value through a transitive fanin cone and a transitive fanout cone of the transformed gate, wherein for at least one pin in the transitive fanin cone or the transitive fanout cone, said updating involves updating the slack value at the pin without first updating an arrival time or a required time at the pin.

2. The method of claim 1, wherein said propagating includes propagating a change in a slack value from a branch point to a set of points by applying the change in the slack value at the branch point to a slack value at each point in the set of points.

3. The method of claim 1, wherein said propagating includes propagating slack values from a set of points to a merge point by:
    selecting a dominant slack value from a set of slack values at the set of points;
    propagating the dominant slack value to the merge point; and
    computing a change in slack value at the merge point for further propagation.

4. The method of claim 1, wherein said propagating includes propagating slack values from a set of input points to a set of output points by:
    selecting a dominant slack value from a set of slack values at the set of input points;
    propagating the dominant slack value to each output point in the set of output points; and
    computing the change in slack value at the output points for further propagation.

5. The method of claim 1, further comprising:
    computing one or more timing metrics based on the updated slack values;
    rejecting the gate transformation if at least one timing metric degrades; and
    committing the gate transformation to the circuit design if none of the timing metrics degrade.

6. The method of claim 1, wherein said propagating does not require evaluating timing-arcs of gates in the transitive fanin cone and the transitive fanout cone.

7. A non-transitory computer-readable storage medium storing instructions that, when executed by a computer, cause the computer to perform a method for updating slack values in a circuit design, the method comprising:
    transforming a gate in a circuit design to optimize delay, area, and/or leakage power;
    determining a change in a slack value at a pin of the transformed gate, wherein the change in the slack value is with respect to a previous slack value at the pin; and
    updating the slack values in the circuit design by propagating the change in the slack value through a transitive fanin cone and a transitive fanout cone of the transformed gate, wherein for at least one pin in the transitive fanin cone or the transitive fanout cone, said updating involves updating the slack value at the pin without first updating an arrival time or a required time at the pin.

8. The non-transitory computer-readable storage medium of claim 7, wherein said propagating includes propagating a change in a slack value from a branch point to a set of points by applying the change in the slack value at the branch point to a slack value at each point in the set of points.

9. The non-transitory computer-readable storage medium of claim 7, wherein said propagating includes propagating slack values from a set of points to a merge point by:
    selecting a dominant slack value from a set of slack values at the set of points;
    propagating the dominant slack value to the merge point; and
    computing the change in slack value at the merge point for further propagation.

10. The non-transitory computer-readable storage medium of claim 7, wherein said propagating includes propagating slack values from a set of input points to a set of output points by:
    selecting a dominant slack value from a set of slack values at the set of input points;
    propagating the dominant slack value to each output point in the set of output points; and
    computing the change in slack value at the output points for further propagation.

11. The non-transitory computer-readable storage medium of claim 7, wherein the method further comprises:
    computing one or more timing metrics based on the updated slack values;
    rejecting the gate transformation if at least one timing metric degrades; and
    committing the gate transformation to the circuit design if none of the timing metrics degrade.

12. The non-transitory computer-readable storage medium of claim 7, wherein said propagating does not require evaluating timing-arcs of gates in the transitive fanin cone and the transitive fanout cone.

13. A system, comprising:
    a processor; and
    a non-transitory computer-readable storage medium storing instructions executable by the processor, the instructions comprising:
        instructions for transforming a gate in a circuit design to optimize delay, area, and/or leakage power;
        instructions for determining a change in a slack value at a pin of the transformed gate, wherein the change in the slack value is with respect to a previous slack value at the pin; and
        instructions for updating the slack values in the circuit design by propagating the change in the slack value through a transitive fanin cone and a transitive fanout cone of the transformed gate, wherein for at least one pin in the transitive fanin cone or the transitive fanout cone, said updating involves updating the slack value at the pin without first updating an arrival time or a required time at the pin.

14. The system of claim 13, wherein said propagating includes propagating a change in a slack value from a branch point to a set of points by applying the change in the slack value at the branch point to a slack value at each point in the set of points.

15. The system of claim 13, wherein said propagating includes propagating slack values from a set of points to a merge point by:
- selecting a dominant slack value from a set of slack values at the set of points;
- propagating the dominant slack value to the merge point; and
- computing the change in slack value at the merge point for further propagation.

16. The system of claim 13, wherein said propagating includes propagating slack values from a set of input points to a set of output points by:
- selecting a dominant slack value from a set of slack values at the set of input points;
- propagating the dominant slack value to each output point in the set of output points; and
- computing the change in slack value at the output points for further propagation.

17. The system of claim 13, wherein the instructions further comprise:
- instructions for computing one or more timing metrics based on the updated slack values;
- instructions for rejecting the gate transformation if at least one timing metric degrades; and
- instructions for committing the gate transformation to the circuit design if none of the timing metrics degrade.

18. The system of claim 13, wherein said propagating does not require evaluating timing-arcs of gates in the transitive fanin cone and the transitive fanout cone.

\* \* \* \* \*